US006753205B2

(12) United States Patent
Halahan

(10) Patent No.: US 6,753,205 B2
(45) Date of Patent: Jun. 22, 2004

(54) METHOD FOR MANUFACTURING A STRUCTURE COMPRISING A SUBSTRATE WITH A CAVITY AND A SEMICONDUCTOR INTEGRATED CIRCUIT BONDED TO A CONTACT PAD LOCATED IN THE CAVITY

(75) Inventor: Patrick B. Halahan, San Mateo, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/352,607

(22) Filed: Jan. 27, 2003

(65) Prior Publication Data

US 2003/0148552 A1 Aug. 7, 2003

Related U.S. Application Data

(62) Division of application No. 09/952,263, filed on Sep. 13, 2001.

(51) Int. Cl.[7] .......................... H01L 21/44; H01L 21/48; H01L 21/50
(52) U.S. Cl. ....................... 438/107; 438/106; 438/110; 438/127; 438/455; 438/456
(58) Field of Search ............................... 438/106–100, 438/118, 127, 455, 456, 459

(56) References Cited

U.S. PATENT DOCUMENTS

| 3,739,463 A | 6/1973 | Aird et al. ..................... 29/580 |
| 3,761,782 A | 9/1973 | Youmans ................. 317/234 R |
| 3,810,129 A | 5/1974 | Behman et al. ....... 340/173 DR |
| 3,811,117 A | 5/1974 | Anderson, Jr. et al. ..... 298/918 |
| 3,881,884 A | 5/1975 | Cook et al. .................... 29/590 |
| 3,991,296 A | 11/1976 | Kojima et al. .......... 219/121 L |

(List continued on next page.)

FOREIGN PATENT DOCUMENTS

| EP | 0238089 A2 | 9/1987 |
| EP | 0807964 A1 | 4/1995 |
| EP | 0698288 | 2/1996 |
| EP | 0757431 A2 | 7/1996 |
| WO | WO 92/03848 | 3/1992 |
| WO | WO 94/09513 | 4/1994 |
| WO | WO 97/45856 | 12/1997 |
| WO | WO 97/45862 | 12/1997 |
| WO | WO 98/19337 | 5/1998 |
| WO | WO 00/79845 A1 | 12/2000 |

OTHER PUBLICATIONS

Anthony, T., "Forming Feedthroughs in Laser–Drilled Holes in Semiconductor Wafers by Double–Sided Sputtering", *IEEE Trans. on Comp., Hybrids, & Mfg. Tech*, vol. CHMT–5, No. 1, Mar. 1982, pp. 171–180.

AZ Corporation, "Plasma Jet Etching Technology and Equipment; Silicon Wafer Thinning & Isotropical Etching at Atmospheric Pressure", Semicon/Europe, Apr. 1995, Geneva, Switzerland, 4 pages.

Christensen, C., et al., "Wafer Through–Hole Interconnections with High Vertical Wiring Densities", *IEEE Trans. on Comp., Pkg. & Mfg. Tech*, Part A, vol. 19, No. 4, Dec. 1996, pp. 516–521.

(List continued on next page.)

*Primary Examiner*—Amir Zarabian
*Assistant Examiner*—Khanh Duong
(74) *Attorney, Agent, or Firm*—Michael Shenker; MacPherson Kwok Chen & Heid LLP

(57) ABSTRACT

Semiconductor dies are bonded to contact pads formed in a substrate's cavity. Vias through the substrate open into the cavity. Conductive lines passing through the vias connect the contact pads in the cavity to contact pads on another side of the substrate. A passage in the substrate opens into the cavity and provides an escape or pressure relief path for material filling the cavity. The passage can also be used to introduce material into the cavity.

16 Claims, 4 Drawing Sheets

U.S. PATENT DOCUMENTS

| | | | |
|---|---|---|---|
| 3,993,917 A | 11/1976 | Kalter | 307/235 F |
| 4,139,401 A | 2/1979 | McWilliams et al. | 148/175 |
| 4,141,135 A | 2/1979 | Henry et al. | 29/580 |
| 4,368,106 A | 1/1983 | Anthony | 204/15 |
| 4,394,712 A | 7/1983 | Anthony | 361/411 |
| 4,463,336 A | 7/1984 | Black et al. | 338/4 |
| 4,467,518 A | 8/1984 | Bansal et al. | 29/571 |
| 4,603,341 A | 7/1986 | Bertin et al. | 357/23.7 |
| 4,612,083 A | 9/1986 | Yasumoto et al. | 156/633 |
| 4,617,730 A * | 10/1986 | Geldermans et al. | 29/843 |
| 4,628,174 A | 12/1986 | Anthony | 219/76.13 |
| 4,722,130 A | 2/1988 | Kimura et al. | 29/413 |
| 4,769,738 A | 9/1988 | Nakamura et al. | 361/283 |
| 4,807,021 A | 2/1989 | Okumura | 357/75 |
| 4,842,699 A | 6/1989 | Hua et al. | 204/15 |
| 4,897,708 A | 1/1990 | Clements | 357/65 |
| 4,903,120 A * | 2/1990 | Beene et al. | 257/704 |
| 4,912,548 A | 3/1990 | Shanker et al. | |
| 4,954,458 A | 9/1990 | Reid | 437/31 |
| 4,978,639 A | 12/1990 | Hua et al. | 437/230 |
| 4,996,587 A | 2/1991 | Hinrichsmeyer et al. | 357/74 |
| 5,064,771 A | 11/1991 | Solomon | 437/3 |
| 5,071,792 A | 12/1991 | VanVonno et al. | 437/227 |
| 5,160,987 A | 11/1992 | Pricer et al. | 257/307 |
| 5,166,097 A | 11/1992 | Tanielian | 437/203 |
| 5,172,303 A | 12/1992 | Bernardoni et al. | |
| 5,191,405 A | 3/1993 | Tomita et al. | 257/777 |
| 5,225,771 A | 7/1993 | Leedy | 324/158 P |
| 5,229,647 A | 7/1993 | Gnadinger | 257/785 |
| 5,239,198 A | 8/1993 | Lin et al. | 257/693 |
| 5,241,456 A | 8/1993 | Marcinkiewicz et al. | 257/686 |
| 5,259,924 A | 11/1993 | Mathews et al. | 156/653 |
| 5,268,326 A | 12/1993 | Lesk et al. | 437/62 |
| 5,270,261 A | 12/1993 | Bertin et al. | 437/209 |
| 5,291,062 A * | 3/1994 | Higgins, III | 257/698 |
| 5,307,240 A * | 4/1994 | McMahon | 361/728 |
| 5,307,942 A | 5/1994 | Quelfeter et al. | 211/26 |
| 5,309,318 A | 5/1994 | Beilstein, Jr. et al. | 361/689 |
| 5,313,097 A | 5/1994 | Haj-Ali-Ahmadi et al. | 257/706 |
| 5,314,844 A | 5/1994 | Imamura | 437/226 |
| 5,322,816 A | 6/1994 | Pinter | 437/203 |
| 5,323,035 A | 6/1994 | Leedy | 257/248 |
| 5,340,771 A | 8/1994 | Rostoker | 437/209 |
| 5,376,825 A | 12/1994 | Tukamoto et al. | |
| 5,380,681 A | 1/1995 | Hsu | 437/209 |
| 5,399,898 A | 3/1995 | Rostoker | 257/499 |
| 5,403,784 A * | 4/1995 | Hashemi et al. | 29/827 |
| 5,414,637 A | 5/1995 | Bertin et al. | 364/489 |
| 5,426,566 A | 6/1995 | Beilstein, Jr. et al. | 361/735 |
| 5,453,404 A | 9/1995 | Leedy | 437/209 |
| 5,463,246 A | 10/1995 | Matsunami | 257/621 |
| 5,466,634 A | 11/1995 | Beilstein, Jr. et al. | 437/180 |
| 5,467,305 A | 11/1995 | Bertin et al. | 365/185.01 |
| 5,468,663 A | 11/1995 | Bertin et al. | 437/43 |
| 5,472,539 A | 12/1995 | Saia et al. | 156/155 |
| 5,472,914 A | 12/1995 | Martin et al. | 437/209 |
| 5,475,318 A | 12/1995 | Marcus et al. | 324/762 |
| 5,478,781 A | 12/1995 | Bertin et al. | 437/209 |
| 5,489,554 A | 2/1996 | Gates | 437/208 |
| 5,494,832 A | 2/1996 | Lehmann et al. | 437/2 |
| 5,502,333 A | 3/1996 | Bertin et al. | 257/685 |
| 5,502,667 A | 3/1996 | Bertin et al. | 365/51 |
| 5,504,036 A | 4/1996 | Dekker et al. | 437/183 |
| 5,506,753 A | 4/1996 | Bertin et al. | 361/705 |
| 5,517,057 A | 5/1996 | Beilstein, Jr. et al. | 257/686 |
| 5,517,754 A | 5/1996 | Beilstein, Jr. et al. | 29/840 |
| 5,532,519 A | 7/1996 | Bertin et al. | 257/777 |
| 5,550,942 A | 8/1996 | Sheem | 385/53 |
| 5,561,622 A | 10/1996 | Bertin et al. | 365/51 |
| 5,563,086 A | 10/1996 | Bertin et al. | 437/52 |
| 5,567,653 A | 10/1996 | Bertin et al. | 437/173 |
| 5,567,654 A | 10/1996 | Beilstein, Jr. et al. | 437/209 |
| 5,571,754 A | 11/1996 | Bertin et al. | 437/209 |
| 5,578,869 A | 11/1996 | Hoffman et al. | |
| 5,596,226 A | 1/1997 | Beilstein, Jr. et al. | 257/690 |
| 5,627,106 A | 5/1997 | Hsu | 438/459 |
| 5,628,917 A | 5/1997 | MacDonald et al. | 216/2 |
| 5,629,835 A | 5/1997 | Mahulikar et al. | |
| 5,646,067 A | 7/1997 | Gaul | 437/180 |
| 5,654,127 A | 8/1997 | Leedy | 430/315 |
| 5,656,553 A | 8/1997 | Leas et al. | 438/15 |
| 5,659,195 A | 8/1997 | Kaiser et al. | 257/415 |
| 5,707,485 A | 1/1998 | Rolfson et al. | 156/643.1 |
| 5,761,044 A | 6/1998 | Nakajima | |
| 5,766,975 A * | 6/1998 | Templeton et al. | 438/107 |
| 5,767,001 A | 6/1998 | Bertagnolli et al. | 438/455 |
| 5,796,165 A | 8/1998 | Yoshikawa et al. | 257/723 |
| 5,798,283 A | 8/1998 | Montague et al. | 438/24 |
| 5,843,844 A | 12/1998 | Miyanaga | 483/694 |
| 5,846,879 A | 12/1998 | Winnerl et al. | 430/666 |
| 5,851,845 A | 12/1998 | Wood et al. | 438/15 |
| 5,869,896 A | 2/1999 | Baker et al. | |
| 5,880,921 A | 3/1999 | Tham et al. | 361/233 |
| 5,888,882 A | 3/1999 | Igel et al. | 438/460 |
| 5,888,883 A | 3/1999 | Sasaki et al. | 438/460 |
| 5,919,548 A | 7/1999 | Barron et al. | 428/138 |
| 5,932,940 A | 8/1999 | Epstein et al. | 310/40 |
| 5,939,782 A | 8/1999 | Malladi | 257/723 |
| 5,944,537 A | 8/1999 | Smith et al. | 439/81 |
| 5,963,788 A | 10/1999 | Barron et al. | 438/48 |
| 5,979,475 A | 11/1999 | Satoh et al. | 134/140 |
| 5,998,292 A | 12/1999 | Black et al. | 438/618 |
| 5,998,860 A | 12/1999 | Chan et al. | 257/723 |
| 5,998,865 A | 12/1999 | Akram | 257/723 |
| 6,004,867 A | 12/1999 | Kim et al. | 438/459 |
| 6,012,336 A | 1/2000 | Eaton et al. | 73/754 |
| 6,013,948 A | 1/2000 | Akram et al. | 257/698 |
| 6,020,629 A | 2/2000 | Farnworth et al. | 257/686 |
| 6,037,667 A | 3/2000 | Hembree et al. | 257/779 |
| 6,054,335 A | 4/2000 | Sun et al. | 438/23 |
| 6,061,169 A | 5/2000 | Feldman et al. | 359/280 |
| 6,071,426 A | 6/2000 | Lee et al. | 216/24 |
| 6,072,608 A | 6/2000 | Psaltis et al. | 359/22 |
| 6,075,239 A | 6/2000 | Aksyuk et al. | 250/229 |
| 6,076,256 A | 6/2000 | Drake et al. | 29/825 |
| 6,083,811 A | 7/2000 | Riding et al. | 438/460 |
| 6,084,777 A | 7/2000 | Kalidas et al. | 361/707 |
| 6,094,244 A | 7/2000 | Kawata et al. | 349/74 |
| 6,097,140 A | 8/2000 | Miller et al. | 313/311 |
| 6,116,756 A | 9/2000 | Peeters et al. | 362/285 |
| 6,116,863 A | 9/2000 | Ahn et al. | 417/322 |
| 6,121,119 A | 9/2000 | Richards et al. | 438/462 |
| 6,126,846 A | 10/2000 | Silverbrook | 216/27 |
| 6,127,274 A | 10/2000 | Igel et al. | 438/710 |
| 6,133,064 A | 10/2000 | Nagarajan et al. | |
| 6,137,164 A | 10/2000 | Yew et al. | 257/686 |
| 6,137,167 A | 10/2000 | Ahn et al. | 257/691 |
| 6,142,358 A | 11/2000 | Cohn et al. | 228/44.7 |
| 6,147,397 A | 11/2000 | Burns et al. | 257/669 |
| 6,149,190 A | 11/2000 | Galvin et al. | 280/735 |
| 6,162,701 A | 12/2000 | Usami et al. | 438/455 |
| 6,163,456 A | 12/2000 | Suzuki et al. | 257/707 |
| 6,176,966 B1 | 1/2001 | Tsujimoto et al. | 156/344 |
| 6,184,060 B1 | 2/2001 | Siniaguine | 438/106 |
| 6,225,028 B1 | 5/2001 | Bhatt et al. | 430/311 |
| 6,239,484 B1 | 5/2001 | Dore et al. | |
| 6,265,771 B1 | 7/2001 | Ference et al. | |
| 6,281,042 B1 | 8/2001 | Ahn et al. | 257/723 |
| 6,285,559 B1 | 9/2001 | Fukiharu | 361/760 |
| 6,322,903 B1 * | 11/2001 | Siniaguine et al. | 428/617 |
| 6,424,033 B1 * | 7/2002 | Akram | 257/718 |

| | | | |
|---|---|---|---|
| 6,461,895 B1 * | 10/2002 | Liang et al. | 438/107 |
| 6,599,774 B2 * | 7/2003 | Hultmark et al. | 438/107 |
| 2002/0074652 A1 * | 6/2002 | Pierce | 257/724 |
| 2002/0113321 A1 * | 8/2002 | Siniaguine | 257/782 |

OTHER PUBLICATIONS

H. Kanbach, J. Wilde, F. Kriebel, E. Meusel, "3D Si–on–Si Stack Package", 1999 Int'l Conference on High Density Packaging and MCMs (pp. 248–253).

IPEC Precision brochure for PACEJET II (©1996), 2 pages.

Kitajo, S., S. Ohkawa, N. Senba, K. Hashimoto, N. Ebihura "Using Thermal Stress Simulation to Estimate Stacked Memory Module Reliability under Thermal Cycle Test" 1999 Int'l Conference on High Density Packaging and MCMs (pp. 414–419).

Semiconductor Magazine, "Semiconductor Magazine—MST vs. MEMS: Where Are We?", http://www.semi.or . . . /92c343ff25ccb2438825696700674ff0!OpenDocumen Jan. 5, 2001, pp. 1–7.

Siniaguine, Oleg, "Plasma Jet Etching at Atmospheric Pressure for Semiconductor Production", First Int'l. Symposium on Plasma Process–Induced Damage, May 13–14, 1996, Santa Clara, pp. 151–153.

* cited by examiner

METHOD FOR MANUFACTURING A STRUCTURE COMPRISING A SUBSTRATE WITH A CAVITY AND A SEMICONDUCTOR INTEGRATED CIRCUIT BONDED TO A CONTACT PAD LOCATED IN THE CAVITY

CROSS REFERENCE TO RELATED APPLICATIONS

The present application is a division of U.S. patent application Ser. No. 09/952,263 filed Sep. 13, 2001, incorporated herein by reference.

BACKGROUND OF THE INVENTION

The present invention relates to semiconductor structures.

In a typical manufacturing process, semiconductor dies are encapsulated into a protective package (e.g., a ceramic or plastic package) and attached to a printed circuit board (PCB).

To reduce system size and signal delays, dies can be bonded directly to a PCB before encapsulation (so-called flip-chip packaging). Dies can also be stacked on top of each other before encapsulation (this is called "vertical integration").

Another technique is described in an article by H. Kanbach et al., "3D Si-on-Si Stack Package", 1999 International Conference on High Density Packaging and MCMs, pages 248–253. Individual dies are attached to a silicon substrate (a "floor") in a flip-chip manner. The floors, with dies attached, are stacked on top of each other, and the whole stack is mounted on a PCB. The stack is mounted so that the dies of each floor are located under the floor. The dies are bonded to contact pads formed on the flat bottom surface of the floor. The floor has a cavity in its upper surface to accommodate the dies bonded to the next floor above. The dies attached to different floors are interconnected by means of metallized vias etched through the floors at locations away from the cavities. According to the article, a large number of interconnections can be provided between the dies attached to different floors.

SUMMARY

The present invention provides structures and fabrication techniques related to semiconductor dies at least partially located in a cavity formed in a substrate. In some embodiments, a metallized via passes through the substrate and opens into the cavity. A die is bonded to a contact pad formed at the end of the via in the cavity. Dies can be bonded to the substrate on both sides, i.e., some dies can be bonded in the cavity, and other dies can be bonded to the substrate's surface opposite to the cavity. The substrate can be mounted on a PCB so that the substrate and the PCB enclose the cavity. The metallized vias do not pass through the thickest portion of the substrate because they terminate at the cavity. Hence, the metallized vias are easier to fabricate. Also, the signal path between the opposite sides of the substrate is shorter. The cavity sidewalls, which laterally surround the cavity, can be made wide to make the structure rigid. This is especially beneficial if the PCB is flexible. The wide sidewalls can also provide support for wire bonding performed to attach bond wires to the substrate's surface opposite to the cavity.

The substrate may have a pressure relief passage connecting the cavity with the substrate's surface other than the surface in which the cavity is formed. The passage can be a through hole, or it can be a groove etched in the substrate's surface in which the cavity is formed. The passage provides an escape or pressure relief path for material filling the cavity. The material can be gaseous (e.g. air), solid, semisolid (soft), or in any phase. The passage can also be used to introduce the material into the cavity. The cavity can thus be easily filled with the material.

The invention is not limited to the embodiments described above. For example, the metal in the vias can be replaced with doped polysilicon or some other conductive material. The pressure relief passages may be non-horizontal passages, and may be incorporated into prior art structures such as described in the aforementioned article by Kanbach et al. Other features of the invention are described below. The invention is defined by the appended claims.

DESCRIPTION OF PREFERRED EMBODIMENTS

Figure 1:
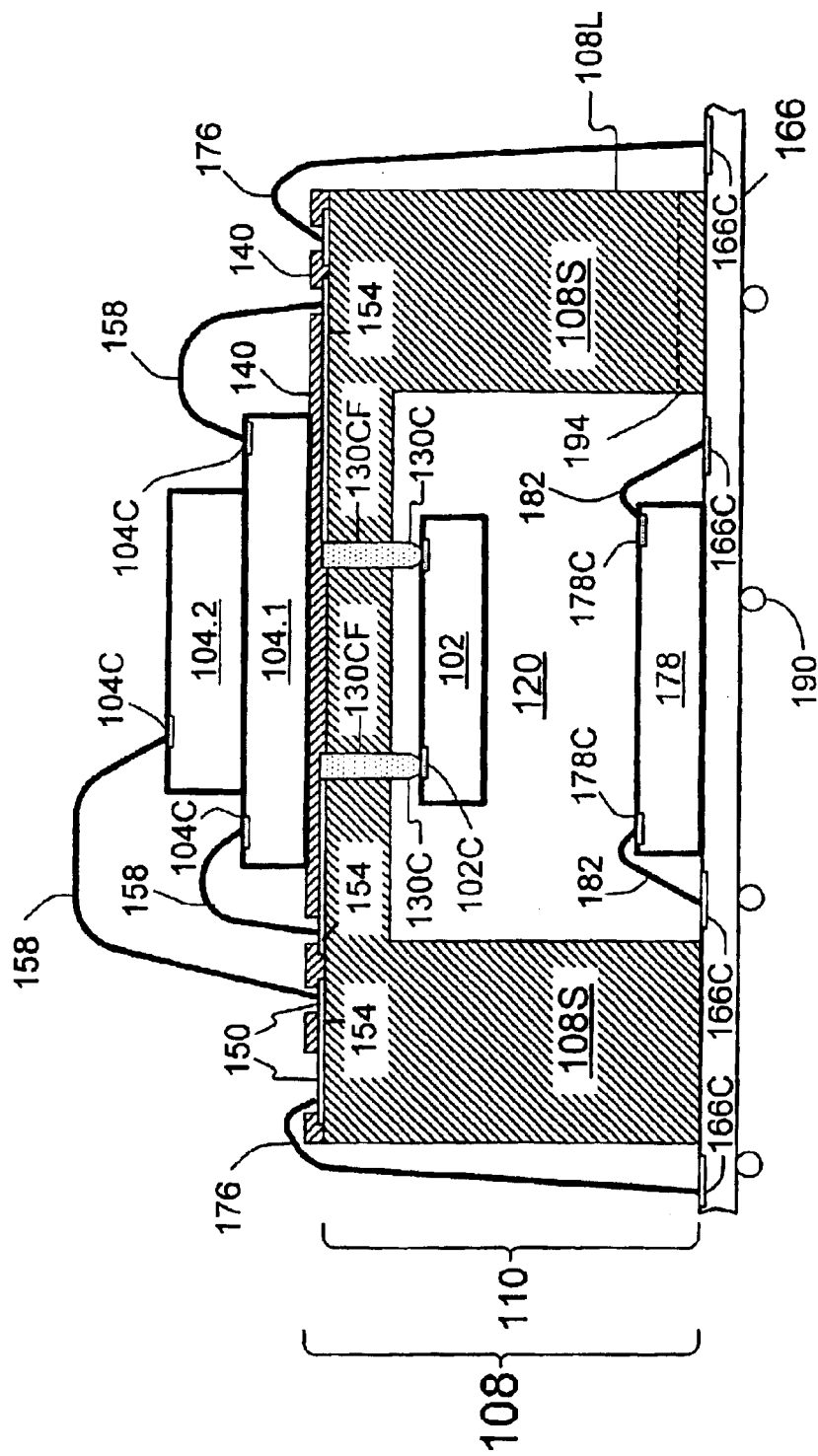
FIGS. 1–3 are cross section illustrations of structures according to the present invention.

FIG. 1 is a cross sectional view of a vertically integrated semiconductor structure. Semiconductor dies 102, 104.1, 104.2 are attached to an interposer 108. Interposer 108 can be made of any suitable material or materials, including semiconductor materials, dielectrics, metals. Interposer 108 can be a semiconductor integrated circuit. Interposer 108 may include a substrate 110 plus dielectric and conductive layers formed in and/or over the substrate. Substrate 110 can be formed of any suitable material or materials, including semiconductor, dielectric and conductive materials. In some embodiments, substrate 110 is a semiconductor substrate, for example, a monocrystalline silicon substrate, processed to form interconnect lines and contact pads as described below. Substrate 110 may also have been processed to form transistors, resistors, capacitors, or other semiconductor devices and circuits, known or to be invented. Such devices and circuits may include semiconductor regions at the top surface of substrate 110.

Die 102 is mounted in a cavity 120 formed in the bottom surface of interposer 108. Contact pads 102C on top of die 102 are bonded to contact pads 130C formed on the interposer at the top of the cavity. Each contact pad 130C is a bottom end of a contact feature 130CF passing through substrate 110 and, possibly, through the entire interposer 108. In FIG. 1, contact features 130CF are covered on top by an insulating layer 140 which is part of interposer 108.

Contact pads 150 and conductive lines 154 are formed at the top of the interposer. The term "contact pad", as used herein, denotes any area to which something can be bonded to form an electrical connection. A contact pad can be located at an end or in the middle of a conductive line. Conductive lines 154 may be formed from a single conductive layer or multiple layers separated by dielectric, and may include doped semiconductor regions of substrate 110. Conductive lines 154 interconnect contact pads 150 and contact features 130CF as needed to form a desired circuit. Conductive lines 154 in combination with contact features 130CF provide conductive interconnects that connect contact pads 150 to contact pads 130C. Conductive lines 154 may also connect the contact pads 150 and contact features 130CF to transistors or other devices formed in or over substrate 110.

Die 104.1 is attached to the top surface of interposer 108. The attachment can be performed with a suitable adhesive.

Also, die 104.1 may have contact pads on its bottom surface that can be bonded to contact pads 150 on top of interposer 108. The contact pads can be bonded with solder, or by anisotropic adhesive, or by thermocompression, or by other techniques, known or to be invented. The invention is not limited to any method of attaching the die 104.1 to interposer 108.

Die 104.2 is attached to the top surface of die 104.1, for example, with an adhesive and/or by bonding a contact pad or pads on the bottom of die 104.2 to a contact pad or pads on the top of die 104.1. Any number of dies 104 can be provided on top of the interposer, and any number of dies 102 can be provided attached to the interposer in cavity 120. Different dies 104 can be stacked on top of each other, or can be attached directly to the interposer. Likewise, different dies 102 can be stacked on top of each other or can be bonded directly to the top wall of cavity 120 (to contact pads 130C). Any number of dies or stacks of dies 104, 102 can be provided.

Discrete wires 158 connect contact pads 104C on top of dies 104.1, 104.2 to contact pads 150 on interposer 108. In some embodiments, wires 158 are bonded to contact pads 104C by conventional wire bonding techniques used in semiconductor packaging technology. In some embodiments, wires 158 connect some contact pads on die 104.1 to contact pads on die 104.2. In some embodiments, wires 158 are absent; electrical connections are provided by bonding the contact pads 150 directly to contact pads (not shown) on the bottom of die 104.1, and by bonding the contact pads 104C on top of die 104.1 to contact pads (not shown) on the bottom of die 104.2.

Interposer sidewalls 108S surround cavity 120 and rest on wiring substrate 166. Sidewalls 108S can be glued to substrate 166 with an adhesive. Substrate 166 can be a printed circuit board (PCB) made of any suitable material. Conventional insulating materials can be employed such as ceramics, alumina, and organic materials. Other materials, known or to be invented, can also be used. In some embodiments, substrate 166 is flexible. Flexible wiring substrates have been made from organic insulating materials such as BT or FR4. The thickness of organic flexible substrate 166 is 50 μm to 150 μm in some embodiments. Other thickness can be used. Interposer sidewalls 108S are rigid, and they strengthen the entire structure. The interposer can be made thin over the cavity to facilitate fabrication of contact features 130CF and shorten the signal paths through these contact features.

Rigid sidewalls 108S provide support for wire bonding, especially when the wires are bonded to those contact pads 150 which are located over or proximate to the sidewalls.

Wiring substrate 166 has a single or multiple layer wiring (not shown) formed using known techniques to interconnect contact pads 166C on the wiring substrate.

Discrete wires 176 connect contact pads 150 to contact pads 166C. In some embodiments, discrete wires connect the contact pads on wiring substrate 166 to contact pads on a die or dies 104.

Die 178 in cavity 120 is attached to wiring substrate 166. Contact pads 178C of die 178 are electrically connected to contact pads 166C of the wiring substrate. The electrical connections between contacts 178C, 166C can be formed with discrete wires 182 (as shown in FIG. 1), or by flip chip technology, or any other technique. Multiple dies 178 can be attached to the wiring substrate in cavity 120. Vertically integrated stacks of dies can also be provided.

Wiring substrate 166 may have solder balls 190 on its bottom surface which can be bonded to other substrates or circuits as needed. The invention is not limited to any particular techniques used to connect the wiring substrate to other circuits or substrates.

In some embodiments, the interposer and substrate 166 completely enclose the cavity. In other embodiments, the interposer sidewalls 108S do not completely surround the cavity. A die or dies 102, 178 partially protrude from the cavity.

Cavity 120 can contain air or some other gas, or can be filled with a liquid or solid insulator. In some embodiments, the cavity is filled with an insulating adhesive (not shown) such as used for underfill in conventional flip-chip technology. Also, an anisotropic adhesive can be used both to fill the cavity and to form electrically conductive bonds between top contact pads on die 102 and contact pads 130C. Solid materials filling the cavity increase the strength of the structure.

In FIG. 1, a passage 194 connects the cavity to lateral outside surface 108L of interposer 108. Passage 194 is a groove formed in the bottom surface of the interposer. Groove 194 reduces stresses that may be caused by thermal expansion or contraction of materials (e.g. air) in the cavity. In addition, when dies 102 are being placed inside cavity 120 or when the interposer is being mounted on substrate 166, groove 194 provides an escape path for the material filling the cavity. This material can include air or an adhesive that has not yet been hardened. Groove 194 can also be used to inject an adhesive or other materials into the cavity. Multiple grooves can be provided.

In some embodiments, a passage or passages 194 are located above the bottom surface of interposer 108. Vertical passages at the top of the cavity can also be provided. A passage can also be neither horizontal nor vertical but at some other angle. Such passages can be made by drilling or other techniques. A passage can also be formed as a groove in wiring substrate 166 underneath sidewall 108S.

In some embodiments, die 102 contains a digital signal processor or some other kind of microprocessor, and dies 104 (i.e. 104.1, 104.2) contain a memory, e.g. a flash memory, connected to the processor. Alternatively, dies 104 may contain a digital signal processor or some other kind of microprocessor, and die 102 may contain a memory. In some embodiments, each of dies 102, 104 includes transistors and/or other active devices.

In one exemplary embodiment, interposer 108 is rectangular in top view, having a length of 5 mm to 25 mm, and a width of 5 mm to 25 mm. The interposer height is 0.1 mm to 0.8 mm. Substrate 110 is made of monocrystalline silicon and has the same length and width.

Cavity 120 has a length of 4 mm to 23 mm, a width of 4 mm to 23 mm, and a height of 0.05 mm to 0.725 mm. The top portion of the interposer, over the cavity, is 0.05 mm thick. The cavity is positioned at the center of substrate 110 when viewed from the top. Sidewalls 108S are 0.5 mm to 1.5 mm thick. Groove 194 is 0.05 mm to 0.2 mm deep (the depth is the vertical dimension in FIG. 1). The groove's width (transversal dimension) is 0.01 mm to 0.2 mm. The invention is not limited to any particular shapes and dimensions.

Figure 2:
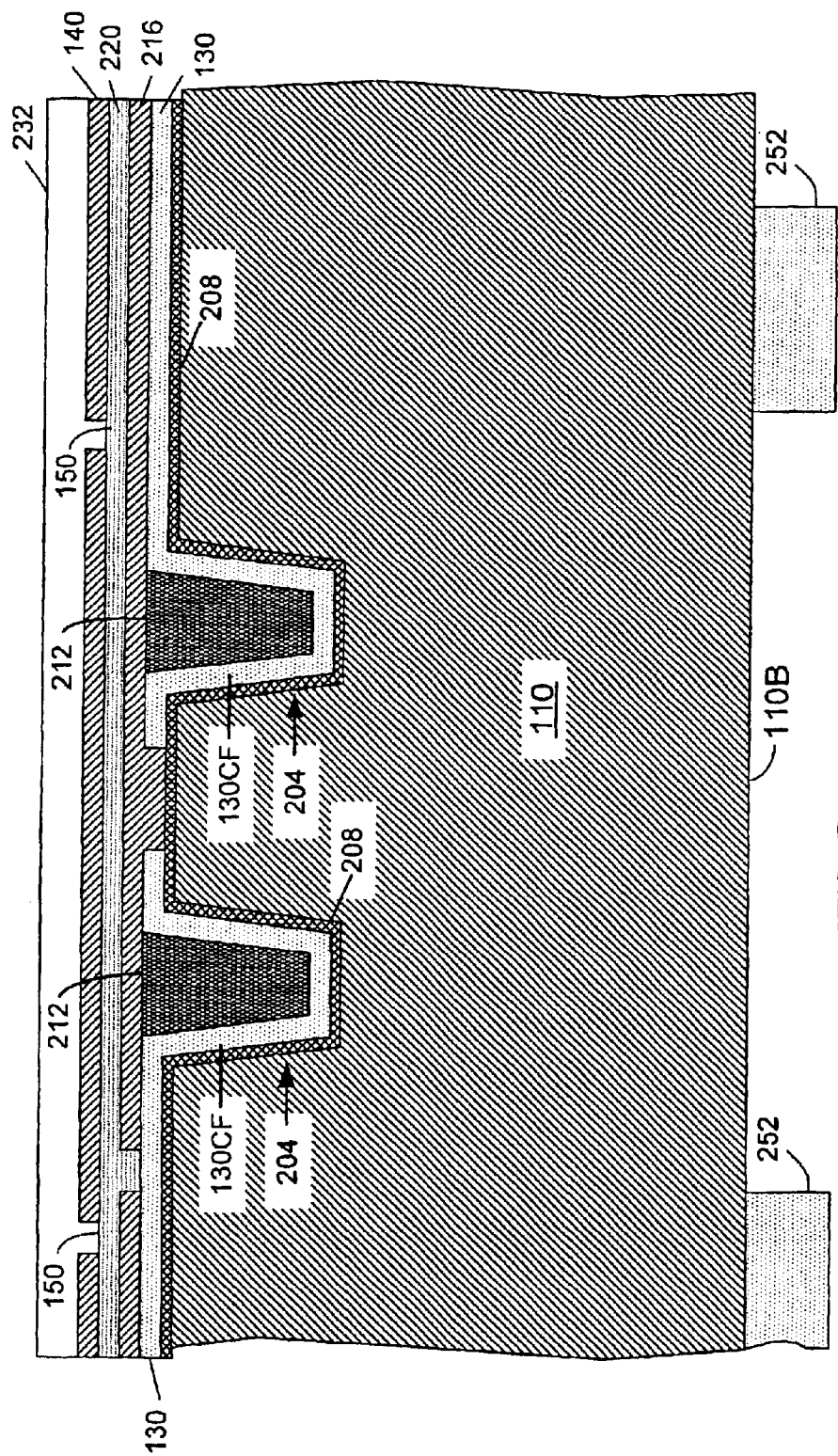
Figure 3:
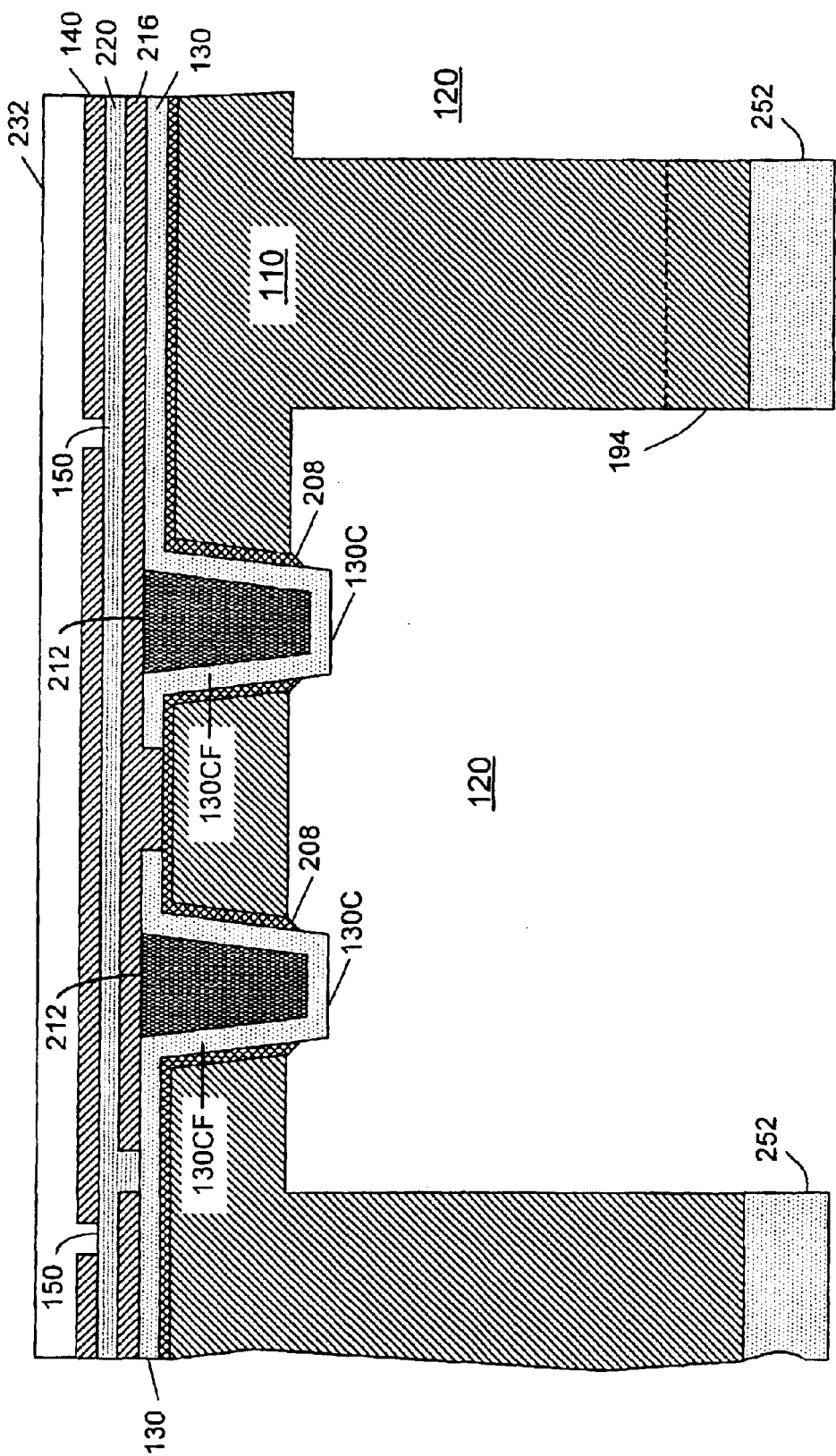
Figure 4:
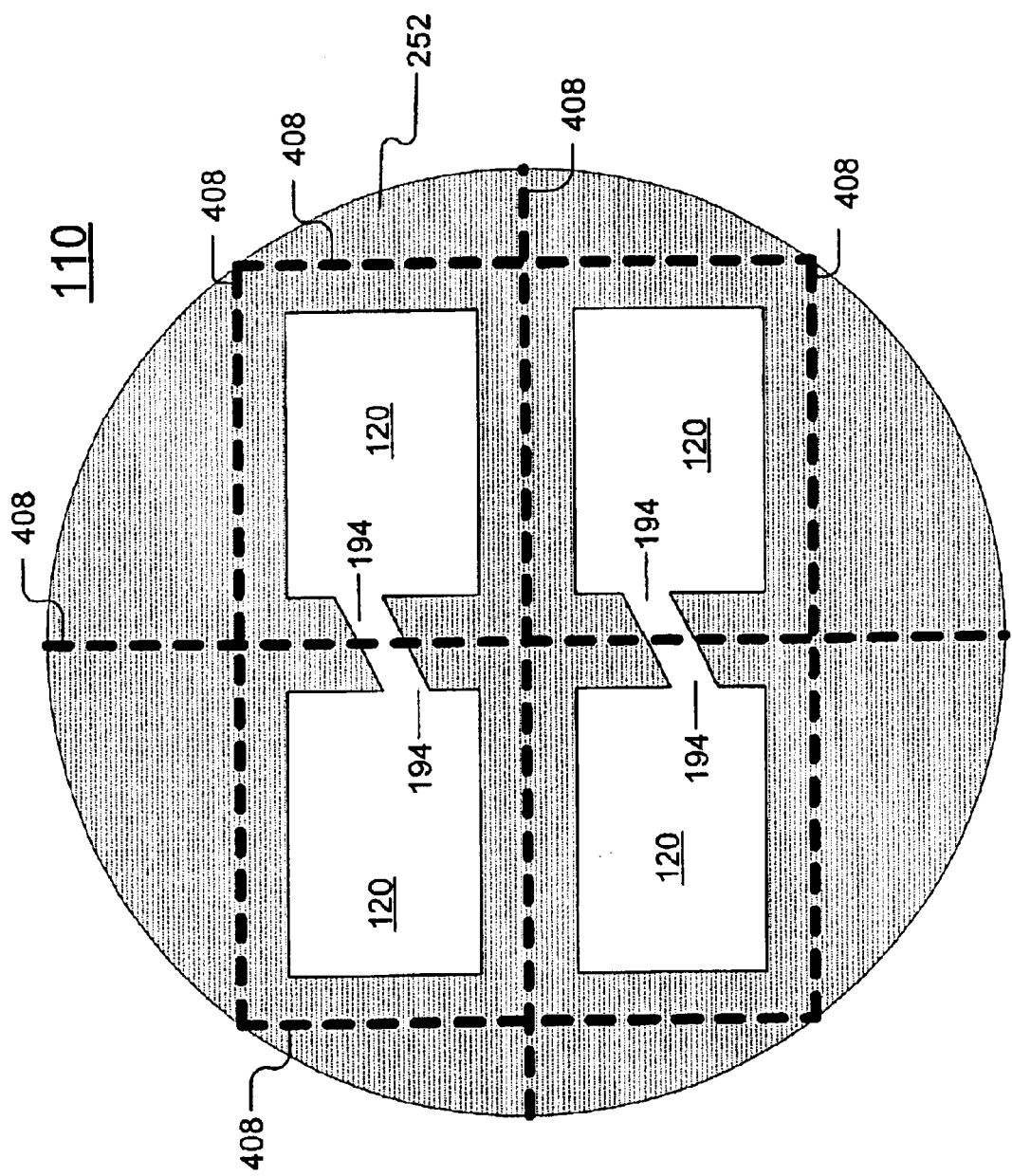
FIG. 4 is a plan view of a structure according to the present invention.

FIGS. 2–4 illustrate an exemplary fabrication process. Fabrication starts with wafer 110. If needed, dicing lines and alignment marks (not shown) are formed on the top surface of wafer 110 at an early fabrication stage using known techniques. If wafer 110 is made of a semiconductor material, then semiconductor circuit elements such as P-N junctions, transistor and diode regions, and other elements, can be formed in and over the wafer. Some embodiments have no such elements.

Vias 204 are etched in the top surface of the wafer. Then dielectric 208 is formed over the wafer. Conductive layer 130 is formed over dielectric 208. Layers 208, 130 cover the sidewalls of vias 104. Optionally, the vias are filled by material 212. The portions of layer 130 in vias 204 provide contact features 130CF. If wafer 110 is made from a dielectric material, layer 208 can be omitted.

The vias and the layers 208, 130, 212 can be formed by processes utilized for backside contacts in vertically integrated circuits. See U.S. Pat. No. 6,184,060 issued Feb. 6, 2001 to O. Siniaguine, incorporated herein by reference. See also U.S. patent application Ser. No. 09/456,225 filed Dec. 6, 1999 by O. Siniaguine et. al., incorporated herein by reference (now U.S. Pat. No. 6,322,903 issued Nov. 27, 2001). In one embodiment, vias 204 are formed by etching monocrystalline silicon wafer 110 with atmospheric pressure plasma in an etcher of type Tru-Etch 3000 (Trademark) available from Tru-Si Technologies, Inc. of Sunnyvale, Calif. Dielectric 208 is BPSG formed by chemical vapor deposition. Layer 130 is aluminum, gold, nickel vanadium (NiV), titanium tungsten (TiW), copper, or some other metal, deposited by sputtering or other known techniques. Filling material 212 is spin-on glass, a polymer, metal, or some other conductive or non-conductive material. Filler 212 increases the mechanical strength of wafer 110 and may also increase the electrical and thermal conductivity of the contact structures in vias 204. Filler 212 can be omitted. In FIG. 1, filler 212 is substantially restricted to the vias 204. The filler does not cover the layer 130 outside the vias. In other embodiments, filler 212 is conductive, and the filler material is left outside the vias, increasing the thickness of layer 130. In still other embodiments, layer 212 is part of layer 130. For example, layer 130 can be tungsten deposited by chemical vapor deposition (CVD) to fill the vias 204. The tungsten can then be etched back to a suitable thickness, and patterned outside the vias. In other examples, layer 130 is copper deposited by electroplating, or nickel deposited by electroless plating.

Dielectric 208, conductive layer 130, and filling layer 212 can be patterned at any suitable steps in the fabrication sequence. Layer 130 can provide conductive lines 154 (FIG. 1) and contact pads 150.

Other conductive layers can be formed over wafer 110 to provide a suitable network of interconnects and contact pads. In the example of FIG. 2, dielectric layer 216 is deposited over layer 130. Vias are etched in dielectric 216 to expose conductive layer 130, filler 212, and/or silicon 110. Conductive layer 220 (for example, aluminum or some other suitable metal), is deposited over insulator 216 and patterned to provide additional lines 154, or parts of lines 154, and contact pads 150.

Passivation layer 140 (for example, BPSG, silicon nitride, or a combination of such layers) is formed over the structure. Passivation 140 is patterned to expose the contact pads 150 made from layers 220, 130, and possibly other layers present in the structure. In some embodiments, the passivation 140 is not patterned at this stage, but is patterned at a later stage of fabrication.

Optionally, a protective layer 232 is formed over layer 140 to protect the circuitry on top of the wafer. A mask 252 is formed on the backside 10B of wafer 110 to define cavities 120. Mask 252 can be made of photoresist and patterned photolithographically as known in the art. Alternatively, mask 252 can be made of aluminum, silicon dioxide, or some other material patterned with photoresist technology. Before the mask is formed, wafer 110 can be thinned if desired. The thinning can be performed by mechanical grinding and/or chemical etching of the wafer backside 10B.

After mask 252 is formed, the wafer is etched through the mask openings to form cavities 120 and expose contact pads 130C (FIG. 3). Suitable etching processes include wafer-thinning process described in the aforementioned U.S. Pat. No. 6,184,060 and U.S. patent application Ser. No. 09/456, 225. Other processes, known or to be invented, can also be used. In one embodiment, the etch is performed at atmospheric pressure in fluorine containing plasma in an etcher manufactured by Tru-Si Technologies, Inc. of Sunnyvale, Calif. Wafer 110 is made of monocrystalline silicon, and dielectric 208 is silicon dioxide. When dielectric 208 becomes exposed on the bottom, the dielectric is etched 810 times slower than silicon. As a result, dielectric 208 protrudes on the bottom around each contact 130C. This protrusion helps insulate the conductive layer 130 from silicon 110 when the contacts 130C are later bonded to die 102. Contacts 130C protrude from the dielectric.

Alternatively, dielectric 208 can be etched in a separate process, after the silicon etch wafer 110, to expose the contacts 130C. An insulator (not shown) can optionally be formed on the inner surface of cavity 120 but not on contact 130C. In some embodiments, the insulator is grown selectively so that it does not form on the contacts 130C. In one silicon wafer embodiment the etch of wafer 110 is performed in atmospheric pressure fluorine containing plasma as described above. When the etch has been completed, the plasma continues to run, but the fluorine containing gas (for example, $CF_4$) is turned off in the plasma reactor. Oxygen, water vapor, nitrogen, or a combination of the above (for example, air), are injected into the plasma. The oxygen or nitrogen react with silicon 110 to form dielectrics such as silicon oxides, silicon nitrides, or oxynitrides. Conductive layer 130 is metal, such as gold or platinum, that does not react with oxygen or nitrogen. See U.S. Pat. No. 6,184,060. Alternatively, layer 130 may include several conductive layers such that the bottom layer does not react with oxygen or nitrogen.

In other embodiments, when the insulator is being formed, a conductive layer is formed on layer 130. For example, layer 130 may include a bottom layer of titanium. Titanium reacts with nitrogen to provide titanium nitride (which is conductive).

In some embodiments, the insulator is formed both on silicon 110 and conductive layer 130. The insulator on layer 130 is later removed selectively so as not to remove the insulator on silicon 110. For example, layer 130 can be made of copper, or have a copper layer on the bottom. The insulator is formed with oxygen, and consists of silicon oxide on silicon 110 and copper oxide on copper layer 130. The copper oxide can be removed by a solder flux when the wafer is bonded to die 102. Solder fluxes are known that remove copper oxide but not silicon oxide.

Groove 194 can be formed by the same etch as cavities 120. FIG. 4 is a bottom view of mask 252 in one such embodiment. The cavities are slanted so as not to follow the crystal planes of wafer 110. (This makes the structure less likely to break along the grooves.) Lines 408 illustrate scribe lines along which the wafer will be diced. Grooves 194 in adjacent dies are joined together. (The invention is not limited to any geometry of grooves 194. Further, in some embodiments, wafer 110 is not diced.)

Grooves 194 are not as deep as cavities 120 because grooves 194 are narrow and therefore are etched slower than the cavities.

Alternatively, grooves 194 can be formed using a separate mask and a separate etch, before or after the etch of cavities 120.

Interposer 108 can be partially or completely diced when the grooves and the cavities have been formed.

Die or dies 102, possibly stacks of dies, are placed in cavity 120 and bonded to contacts 130C. Before bonding, the dies have been processed to form integrated circuits. In some embodiments, the bonding is performed by solder. Pads 102C on dies 102 are made of aluminum, and are covered with some solder wettable material, e.g. zinc or gold deposited in an electrodeless bath. Solder balls (not shown) are formed on contacts 130C. Contacts 130C protrude to facilitate the bonding process.

The bonding can also be performed without solder. For example, thermocompression, anisotropic adhesive, or other techniques, known or to be invented, can be used.

If the interposer has not been diced, it can be partially or completely diced from the top along the lines 408 at this stage. If the interposer has been partially diced, the interposer singulation can be completed.

If the protective layer 232 has been used, this layer can be removed at any suitable stage before attachment of dies 104 to the interposer, and mask 252 can be removed before attachment of the interposer to substrate 166. Dies 104 can be attached to the top surface of interposer 108 before or after attachment of substrate 166.

Wires 158 are bonded to contact pads 104C, 150.

Die or dies 178 are attached to PCB 166, and wires 182 are bonded. A filler (not shown) is placed into cavity 120 or on PCB 166 if desired. The filler can be soft at this stage. Then interposer 108 is attached to PCB 166. The filler fills the cavity. Wires 176 are bonded to contacts 150, 166C.

Wires 158, 176, 182 can be more or less rigid as desired. They can be metal traces formed on a flexible tape, possibly an insulating tape. The wires can be attached using wire bonding or tape—automated bonding techniques or other techniques, known or to be invented.

Then an encapsulant (not shown) is deposited over the die structure and, possibly, over the wires 158, 176, and is cured, using known techniques.

The above fabrication sequence is exemplary and not limiting. For example, dies 104 can be mounted on interposer 108 before or after bonding of the interposer to die 102 or wiring substrate 166. Bond wires 158, 176 can be attached in any order.

In some embodiments, a die or dies 104 extend beyond the edge of the interposer 110 to leave more room for contact pads 150 attached to discrete wires. In some embodiments, a die 104 has the same or larger area than the interposer 110. The die is shifted relative to the interposer, protruding beyond the edge of the interposer, to make room for such contact pads on the top surface of the interposer.

In some embodiment, the interposer is not diced.

In some embodiment, the interposer wafer, or a single interposer die, includes multiple cavities 120. Each cavity may include a die or dies 102, 178.

The invention is not limited to the embodiments described above. The invention is not limited to any particular materials, fabrication processes, or order of process steps. Contact features 130CF can be formed by etching or drilling holes through substrate 110 and metallizing the holes. See for example the aforementioned article by H. Kanbach et al., "3D Si-on-Si Stack Package", 1999 International Conference on High Density Packaging and MCMs, pages 248–253, incorporated herein by reference. The holes can be formed after the cavities. Dies 104, 178 may be replaced with packaged integrated circuits. An insulating or conductive layer may include a combination of layers. References to top and bottom surfaces of a die or an interposer do not mean that the structure must be oriented with the "top" surface facing up and cannot be placed upside down or in some other orientation. Other embodiments and variations are within the scope of the invention, as defined by the appended claims.

What is claimed is:

1. A manufacturing method comprising:

forming or more vias in a first substrate of a semiconductor material having a first side and a second side opposite to the first side, wherein the vias are formed in the second side, wherein the vias do not go through the first substrate;

forming a dielectric and a conductor in at least one of the vias;

forming a mask over the first side of the first substrate to define a cavity;

removing material from the first side of the first substrate to form said cavity, wherein the material removing operation comprises:

removing semiconductor material of the first substrate to expose the dielectric on the first side of the first substrate;

after exposing the dielectric on the first side of the first substrate, removing the dielectric to expose the conductor;

wherein at a conclusion of the material removing operation, the conductor protrudes on the first side in the cavity, and wherein one or more first contact pads are made in the cavity using the protruding conductor;

bonding a contact pad of a first semiconductor die to one of the first contact pads to cause the contact pad of the first semiconductor die to adhere to the one of the first contact pads;

attaching, and electrically connecting, one or more second semiconductor dies to the second side of the first substrate.

2. The method of claim 1 wherein attaching and electrically connecting the one or more second semiconductor dies comprises electrically connecting a second contact pad on the second side of the first substrate to a third contact pad of at least one second die, the second contact pad being connected to one of the first contact pads by one or more of conductive lines that include said conductor.

3. The method of claim 2 wherein the second contact pad is either (a) bonded to the third contact pad to adhere to the third contact pad, or (b) is connected to the third contact pad by a discrete wire.

4. The method of claim 1 further comprising attaching a wiring substrate to the first substrate, the first substrate and the wiring substrate at least partially enclosing the cavity.

5. The method of claim 4 wherein the first substrate comprises a passage connecting the cavity to the first substrate's surface other than a surface in which the cavity is formed.

6. The method of claim 4 further comprising attaching an integrated circuit to the wiring substrate and attaching the wiring substrate to the first substrate so that the integrated circuit is located in the cavity.

7. The method of claim 4 further comprising bonding a wire to a contact pad on the second side of the first semiconductor substrate and to a contact pad on the wiring substrate to connect the contact pad on the second side of the first semiconductor substrate to the contact pad on the wiring substrate.

8. A manufacturing method comprising:

forming a cavity in a first surface of a first substrate, the cavity having sidewalls, forming one or more grooves in the first surface, each groove connecting the cavity to the first substrate's surface other than the first surface, and forming one or more first contact pads in the cavity;

placing one or more semiconductor integrated circuits into the cavity and bonding one or more contact pads of the one or more semiconductor integrated circuits to the one or more first contact pads to cause the one or more contact pads of the one or more semiconductor integrated circuits to adhere to the one or more first contact pads;

covering the cavity with a wiring substrate, and electrically connecting a contact pad on the wiring substrate to a contact pad on the first substrate, the first substrate and the wiring substrate completely enclosing the cavity except for the one or more grooves.

9. The method of claim 8 wherein each of the one or more grooves provides: (a) a pressure-relief and/or escape path for material in the cavity, and/or (b) an inlet for injecting a material into the cavity.

10. The method of claim 8 wherein the grooves are not as deep as the cavity, the depth being a dimension perpendicular to the first surface.

11. The method of claim 8 wherein the first substrate comprises a semiconductor substrate, wherein the cavity and the grooves are formed in the semiconductor substrate, and the method further comprises:

forming one or more vias each of which passes through the semiconductor substrate, wherein each first contact pad is provided by a conductive layer formed in one of the vias and protruding out of one of the vias.

12. The method of claim 8 wherein the cavity and the one or more grooves are formed simultaneously.

13. The method of claim 8 wherein the first substrate is a semiconductor substrate.

14. The method of claim 13 wherein forming the cavity and the one or more grooves comprises a masked etch which simultaneously etches the first surface of the semiconductor substrate at the location of the cavity and at the location of the one or more grooves.

15. The method of claim 14 wherein during at least a portion of the masked etch, the one or more grooves are etched slower than the cavity, resulting in the one or more grooves being not as deep as the cavity.

16. The method of claim 15 wherein each of the one or more grooves is more narrow than the cavity.

* * * * *